(12) United States Patent
White et al.

(10) Patent No.: US 7,070,669 B1
(45) Date of Patent: Jul. 4, 2006

(54) METHOD FOR FORMING CERAMIC THICK FILM ELEMENT ARRAYS

(75) Inventors: Stephen D. White, Santa Clara, CA (US); Baomin Xu, Cupertino, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 11/017,325

(22) Filed: Dec. 20, 2004

(51) Int. Cl.
C03B 29/00 (2006.01)

(52) U.S. Cl. ............... 156/89.11; 156/289; 156/247; 156/235; 156/155; 156/241; 156/230; 156/80

(58) Field of Classification Search ............. 156/89.11, 156/230, 247, 289, 155, 241, 80
See application file for complete search history.

(56) References Cited

U.S. PATENT DOCUMENTS

| | | | |
|---|---|---|---|
| 4,345,967 A | 8/1982 | Cook | |
| 5,480,503 A * | 1/1996 | Casey et al. | ............. 156/89.18 |
| 6,051,448 A * | 4/2000 | Hayama et al. | ............. 438/108 |
| 6,071,795 A | 6/2000 | Cheung et al. | |
| 6,335,263 B1 | 1/2002 | Cheung et al. | |
| 6,911,107 B1 * | 6/2005 | Kagawa et al. | ............. 156/230 |

* cited by examiner

*Primary Examiner*—Chris Fiorilla
*Assistant Examiner*—Kim McClelland
(74) *Attorney, Agent, or Firm*—Fay, Sharpe, Fagan, Minnich & McKee, LLP

(57) ABSTRACT

An improved process for producing ceramic thick film array elements is provided. In this regard, ceramic elements are formed on a temporary, or printing, substrate by screen printing or other forming methods. The temporary, or printing, substrate is advantageously provided with a release layer. This makes it possible to release the printed and soft-baked ceramic elements from the temporary substrate and transfer the ceramic elements to the sintering substrate. The contemplated release technique takes advantage of the phase transition of a liquid, e.g. water, to transfer the elements to a sintering substrate. After sintering and electrode deposition, the ceramic element array is bonded to a target substrate. Then, the sintering substrate is removed to make the array available for implementation in a variety of suitable environments.

20 Claims, 6 Drawing Sheets

METHOD FOR FORMING CERAMIC THICK FILM ELEMENT ARRAYS

BACKGROUND

The present exemplary embodiments relate to a method for forming ceramic thick film element arrays. It finds particular application in conjunction with the formation of ceramic elements such as piezoelectric thick film arrays, such as lead zirconate titanate (PZT) arrays, and will be described with particular reference thereto. However, it is to be appreciated that the present exemplary embodiments are also amenable to other like applications such as production of other ceramic thick film arrays.

By way of background, thick (e.g., 10 to 100 μm thickness range) ceramic or piezoelectric material, such as PZT films, have many potential uses in micro-electromechanical (MEMS) devices, inkjet printers and ultrasonic transducers. However, producing films in this thickness range on commonly used substrates such as silicon, metal and plastic has been found to be very difficult. These substrates cannot withstand the temperatures used to sinter the ceramic thick films. Generally, it is beyond the ability of thin film methods such as sol-gel and sputtering to produce suitable devices. It is likewise beyond the ability of bulk ceramic processing to do so.

A number of processes for forming thin film materials or bulk materials are known. For example, U.S. Pat. No. 6,071,795, entitled "Separation of Thin Films from Transparent Substrates by Selective Optical Processing," discloses a method for separating a thin film of gallium nitride that is grown on a sapphire substrate. The thin film is bonded to an acceptor substrate, and the sapphire substrate is laser irradiated with a scanned beam at a wavelength at which the sapphire is transparent but the gallium nitride is strongly absorbing. After the laser irradiation, the sample is heated above the melting point of gallium, and the acceptor substrate and attached gallium nitride thin film are removed from the sapphire growth substrate.

Another method relating to the transfer of bulk and thin film materials is disclosed in U.S. Pat. No. 6,335,263, entitled "Method of Forming a Low Temperature Metal Bond for Use in the Transfer of Bulk and Thin Film Materials". In this document, a method of forming a low temperature metal bond is disclosed as including a step of providing a donor substrate, having a thin film grown thereon. An acceptor substrate is then produced and a multilayer metal bond interface for positioning between the thin film and the acceptor substrate is then selected. A bonded layer is then formed between the thin film and the acceptor substrate using the multilayer metal bond interface. The donor substrate is then severed from the thin film to isolate the thin film for subsequent processing.

Both of these methods contemplate the use of sapphire. As those of skill in the art will appreciate, sapphire is expensive and may, thus, render implementation on a large scale impractical. Both of these methods also contemplate the use of irradiation, e.g. laser lift-off, to release elements from a substrate.

Moreover, conventional ceramic thick films, such as screen-printed PZT films, need to be sintered at more than 1100° C. Thus, only a few substrates—such as aluminum oxide or zirconium oxide—can be used. Therefore, even if one were to attempt to adapt and use the above referenced thin film applications for thick film applications, there are several apparent drawbacks. First, such a method of production would require a large, up-front investment to buy the expensive sapphire substrates. The expected return (e.g. profit) to be enjoyed by the resultant ceramic material made from this process would typically not justify the cost of the sapphire substrates. Secondly, sintering the ceramic elements at 1250° C. or higher in a lead rich environment would surely result in some diffusion or inter-reaction, i.e. undesired bonding, between the ceramic, or PZT, films and the substrate. This will make the contemplated laser liftoff more difficult and may increase the process cost.

Accordingly, an improved and more efficient process is desired to transfer ceramic elements, such as thick film PZT elements, from a substrate upon which they are formed (but which does not comprise a sintering substrate), without using an optical or radiation technique.

BRIEF DESCRIPTION

In accordance with one aspect of the present exemplary embodiments, a method comprises forming ceramic elements on a temporary substrate, transferring the ceramic elements onto a sintering substrate having a temporary adhesion layer by transitioning the temporary adhesion layer through phase changes, sintering the ceramic elements and transferring the ceramic elements to a target substrate.

In accordance with another aspect of the present exemplary embodiments, the ceramic elements are piezoelectric elements.

In accordance with another aspect of the present exemplary embodiments, the ceramic elements are lead zirconate titanate (PZT).

In accordance with another aspect of the present exemplary embodiments, the temporary adhesion layer is water.

In accordance with another aspect of the present exemplary embodiments, a method for forming thick film ceramic element arrays comprises providing a printing substrate having a release layer, applying a carrier coating to the release layer, forming ceramic elements on the carrier coating, providing a sintering substrate with a temporary adhesion layer, joining the printing substrate and the sintering substrate such that the ceramic elements are embedded in the adhesion layer, implementing a phase change to promote the adhesion, removing the printing substrate and the release layer such that the ceramic elements remain in the adhesion layer, removing the adhesion layer such that the ceramic elements remain on the sintering substrate, sintering the ceramic elements on the sintering substrate, depositing optional electrodes on the ceramic elements and transferring the ceramic elements to a target substrate, and finally depositing optional secondary electrodes on the ceramic elements.

In accordance with another aspect of the present exemplary embodiments, the method further comprises providing tape between the release layer and the printing substrate.

In accordance with another aspect of the present exemplary embodiments, applying the carrier coating comprises spin coating.

In accordance with another aspect of the present exemplary embodiments, the carrier coating is a vehicle used to form ceramic paste.

In accordance with another aspect of the present exemplary embodiments, the forming of ceramic elements comprises forming piezoelectric elements.

In accordance with another aspect of the present exemplary embodiments, the forming of ceramic elements comprises forming lead zirconate titanate (PZT).

In accordance with another aspect of the present exemplary embodiments, the temporary adhesion layer is water.

In accordance with another aspect of the present exemplary embodiments, the phase change comprises changing from a liquid phase to a solid phase of water.

In accordance with another aspect of the present exemplary embodiments, implementing the phase change comprises freezing.

In accordance with another aspect of the present exemplary embodiments, the removing of the adhesion layer comprises melting and drying.

In accordance with another aspect of the present exemplary embodiments, the method further comprises depositing second electrodes on the ceramic elements.

In accordance with another aspect of the present exemplary embodiments, the method comprises providing a printing substrate having a release layer, applying a vehicle layer to the release layer, forming PZT elements on the vehicle layer, providing a sintering substrate having a water layer, joining the printing substrate and the sintering substrate such that the PZT elements are wetted by the water layer, freezing the water, removing the printing substrate and the release layer such that the PZT elements remain in the frozen water, melting and drying the water, sintering the PZT elements on the sintering substrate, depositing electrodes on the PZT elements and transferring the PZT elements to a target substrate, and finally depositing secondary electrodes on the PZT elements.

DETAILED DESCRIPTION

According to the presently described exemplary embodiments, an improved process for producing ceramic thick film array elements is provided. In this regard, ceramic elements are formed or screen printed on a temporary, or printing, substrate. The temporary, or printing, substrate is advantageously provided with a release layer. This makes it possible to release the printed and soft-baked ceramic elements from the temporary substrate. The contemplated release technique takes advantage of the phase transition of a liquid, e.g. water, to transfer the elements to a sintering substrate. After sintering and optional electrode deposition, the ceramic element array is bonded or transferred to a target substrate. One of the bonding methods could be using a thin epoxy bond which can provide electric contact through the asperity points on the surface of the ceramic elements or the target substrate. Then, the sintering substrate is removed to make the array available for implementation in a variety of suitable environments. Optional secondary electrodes deposition can be made after removing the sintering substrate.

In this way, a process for making, for example, piezoelectric (PZT) thick film element arrays on virtually any kind of substrate, is implemented. An advantage of such a technique is that it does not require any optical or radiation technique. Moreover, the process is not overburdened with expensive materials and processes.

Figure 1:
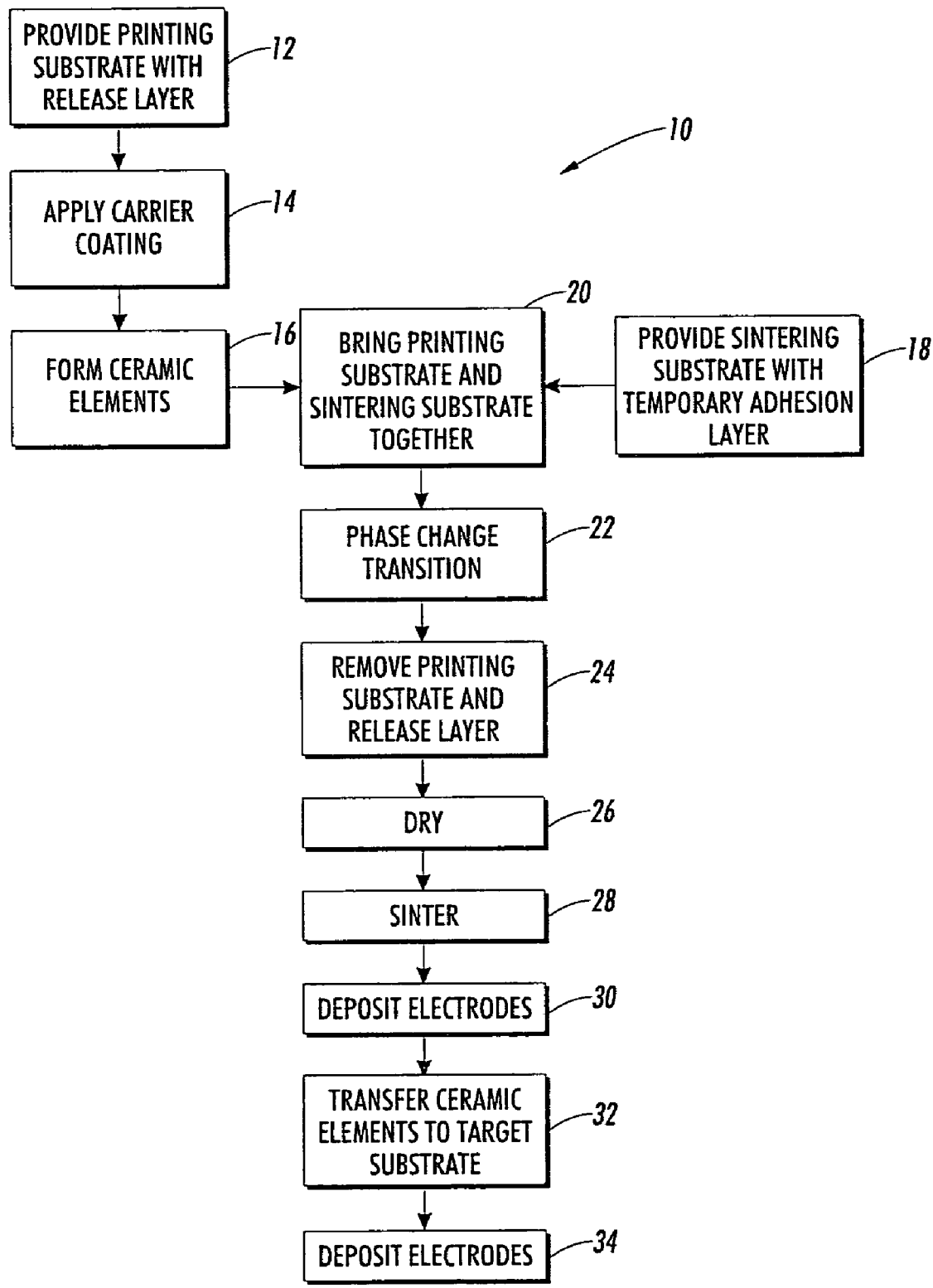
FIG. 1 is a flow chart illustrating a method according to the present exemplary embodiments.

Referring now to FIG. 1, in an illustrative method 10 (that will be described in greater detail below with reference to FIGS. 2 through 15), a temporary substrate is prepared with a release layer for printing (at 12) and a carrier coating is applied or spin coated onto the release layer surface and then soft baked (at 14). Next, ceramic elements such as PZT elements are screen printed or otherwise formed onto the prepared substrate (at 16). A sintering substrate (i.e., ceramic alumina) is then prepared with an adhesion layer, e.g., wetted with enough water to totally wet the PZT elements and the surrounding dried vehicle when joined (at 18). The printed substrate is then joined or stacked with the sintering substrate by placing its printed side (appropriately registered with the sintering substrate) against the water allowing it to totally wet the soft-baked PZT and vehicle (at 20). Any excess water is removed and the substrate stack is placed in a freezer (−43° C.) for approximately twenty (20) minutes to initiate a phase change of the water from liquid to solid (at 22). The frozen assembly is removed from the freezer. The temporary substrate along with the release layer are then removed (at 24), leaving the ceramic elements and vehicle layer frozen to the sintering substrate/ice. This remaining assembly is placed into a drying oven where the water is allowed to evaporate (i.e., 105° C. for 10 minutes) (at 26). The dried assembly is sintered (at 28) and appropriate electrodes are deposited (at 30). Finally, the PZT elements are transferred to the appropriate target substrate using an epoxy bonding method or any other suitable methods (at 32). Other electrodes may be optionally deposited (at 34).

Figure 2:
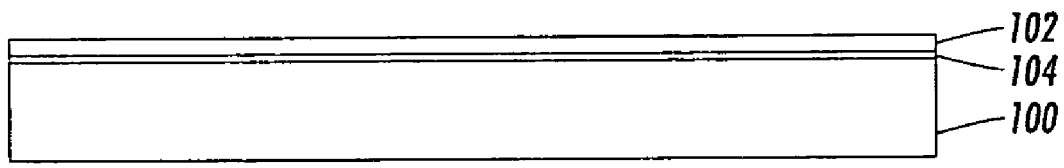
FIG. 2 is an illustration of a part of a method according to the present exemplary embodiments.

Referring now to FIG. 2, a temporary, or printing, substrate 100 has disposed or formed thereon a release layer 102 upon which ceramic elements (such as PZT elements) may be printed. The temporary substrate 100 may take a variety of forms; however, in this exemplary case, a glass substrate is used. The release layer 102 may likewise take a variety of suitable forms. In addition, the release layer 102 may be applied to the temporary substrate 100 in a variety of manners. In one exemplary form, the release layer 102 includes a high tack release side and a low tack release side and is adhered to the temporary substrate 100 using a tape 104. In one form, the tape is of an acrylic type and has a high tack side and a low tack side. Although a variety of configurations will suffice, in one example embodiment, the low tack side of the acrylic tape 104 is applied to the temporary substrate 100 while the high tack side of the acrylic tape 104 faces the release liner. In this illustrative configuration, the low tack release side of the release layer 102 thus faces the high tack side of the acrylic tape 104. Consequently, the high tack release side of the release layer 102 faces away from the tape 104 and the temporary substrate 100 to provide a surface upon which ceramic elements, such as PZT elements, may be printed or otherwise formed without premature release.

It should be understood by those of skill in the art that the release layer 102 and associated tape 104 may be comprised of double-sided tape that is commercially available. For example, one such suitable tape bears the 3M brand and is sold as "3M Repositionable Tape 9415PC." Of course, even using commercially available tape, it may be necessary to adapt the product to fit the objectives of the presently described embodiments. For example, the liner that is typically provided with the tape may serve as the release layer 102, but it may need to be reoriented as described above to provide the appropriate level of adhesion on the printing surface.

It should also be understood that it can be difficult to directly print PZT elements onto release paper. The problem is that there is typically not enough adhesion force between a first layer of soft-baked PZT slurry and the release paper when a successive layer of PZT slurry is printed. However, by providing an extra carrier coating on the release layer, high-quality PZT elements can be printed. Such quality is consistent with the quality achieved by printing directly on sapphire. The PZT elements are then screen printed as one or a sequence of several layers onto the prepared substrate in registration with one another in the case of several layers (each one individually soft-baked).

Figure 3:
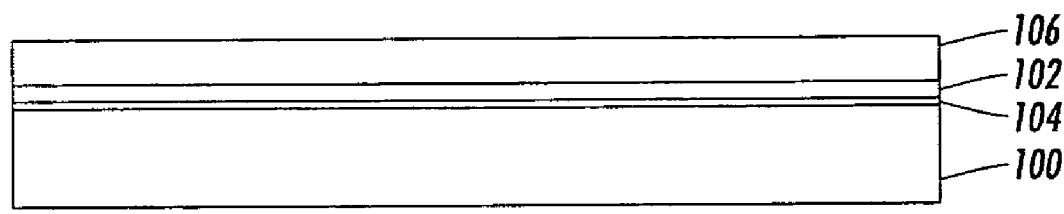
FIG. 3 is an illustration of a part of a method according to the present exemplary embodiments.

In this regard, referring now to FIG. 3, a carrier coating 106 has been spin coated, or spun, onto the release layer 102. The coating may vary in thickness depending on the exact materials used, the process conditions, . . . , etc.; however, in one form, the coating is sufficiently thick to provide structural integrity during the process. In addition, spinning the material over the entire surface will allow for improved results, as compared to merely coating the areas where the printing will take place. The coating 106 is then soft-baked (e.g., baked at approximately 60° C.–80° C.).

The carrier coating 106 may take a variety of forms. However, in one form, the carrier coating 106 as embodied could be an organic vehicle used in the manufacture of ceramic pastes, such as ethyl cellulose. Ethyl cellulose is commonly used as a vehicle in the manufacture of the exemplary PZT paste that is ultimately printed thereon.

Figure 4:
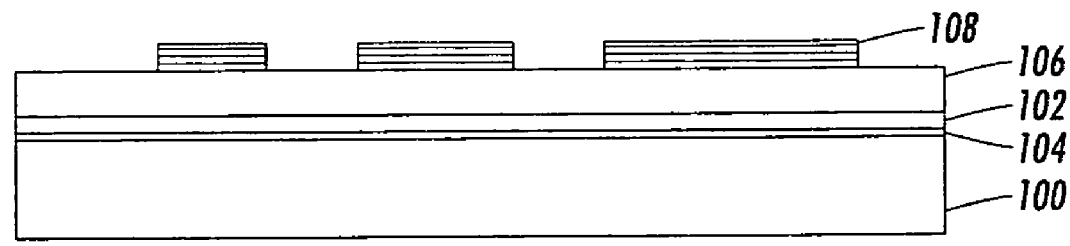
FIG. 4 is an illustration of a part of a method according to the present exemplary embodiments.

Referring to FIG. 4, ceramic elements such as PZT elements 108 have been screen printed as one or a succession of several layers of ceramic paste onto the soft-baked carrier coating 106. It will be understood that the ceramic paste that is used in this exemplary embodiment is a PZT paste comprised of PZT powder, a vehicle such as ethyl cellulose and a solvent such as terpinol. Any suitable screen printing technique that allows for the formation of multiple layers of the elements without undue pressure may be implemented. In at least one form, the technique is conducive to the registration of one layer to the next layer. It should be appreciated that the screen-printing pattern and technique will vary depending on the ultimate application. These elements 108 are then soft baked (one layer at a time if multi-layered) at approximately 60° C.–80° C. to transform them from a paste-like material to a solid, albeit relatively weak, material. In this regard, the soft-baking process typically removes the solvent from the slurry of paste to render it solid, but it does not harden the compound. In addition to screen printing, other forming methods can also be used to form the ceramic elements, which include, but are not limited to, jet printing, extrusion, and tape casting.

Figure 5:
FIG. 5 is an illustration of a part of a method according to the present exemplary embodiments.

Referring now to FIG. 5, a sintering substrate 150 (e.g., a substrate formed of ceramic alumina or other similar heat resistant material) is provided with a temporary bonding or adhesive layer. In one form, the temporary bonding or adhesive layer takes the form of a water layer 152. This layer 152 includes enough liquid to totally wet the PZT elements 108 and the surrounding soft-baked vehicle or carrier coating 106. As will be appreciated, water is a suitable material for providing the temporary adhesive layer because it provides adhesive qualities in its solid form but leaves no residue once removed (e.g. through evaporation). It will be understood that other materials can be used as an alternative to water. For example, other sublimable materials may be used. In addition, any other material that has a phase transition that may serve to provide a temporary adhesive layer would suffice.

Figure 6:
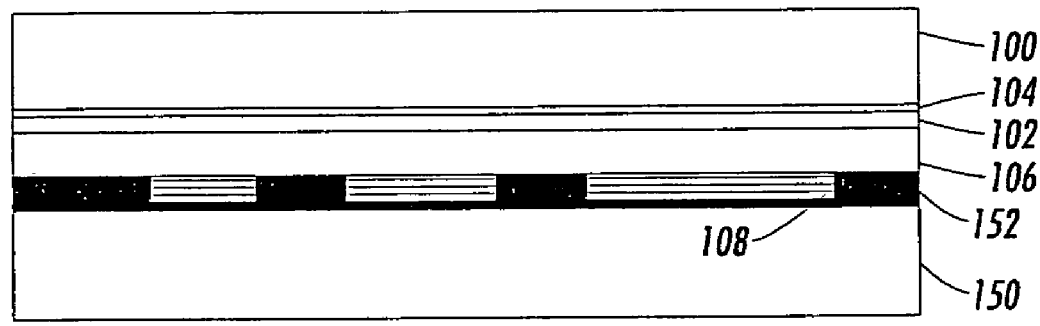
FIG. 6 is an illustration of a part of a method according to the present exemplary embodiments.

Referring to FIG. 6, the printed substrate of FIG. 4 has been placed with its printed side against the layer 152 on the sintering substrate 150. Any excess liquid is removed. The ceramic elements are essentially embedded within the temporary adhesion layer. Then, the substrate stack placed in a freezer (at approximately −43° C.) for approximately twenty (20) minutes. Of course, the temperature and time period will vary from application to application.

Figure 7:
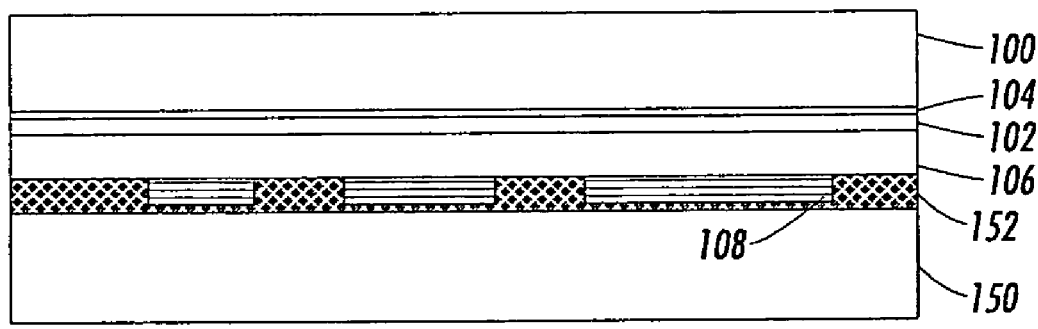
FIG. 7 is an illustration of a part of a method according to the present exemplary embodiments.

As shown in FIG. 7, the assembly of FIG. 6 has been removed from the freezer. Of note, the layer 152 has undergone a phase transition from a liquid phase to a solid phase. The other elements remain in substantially the same state as before.

Figure 8:
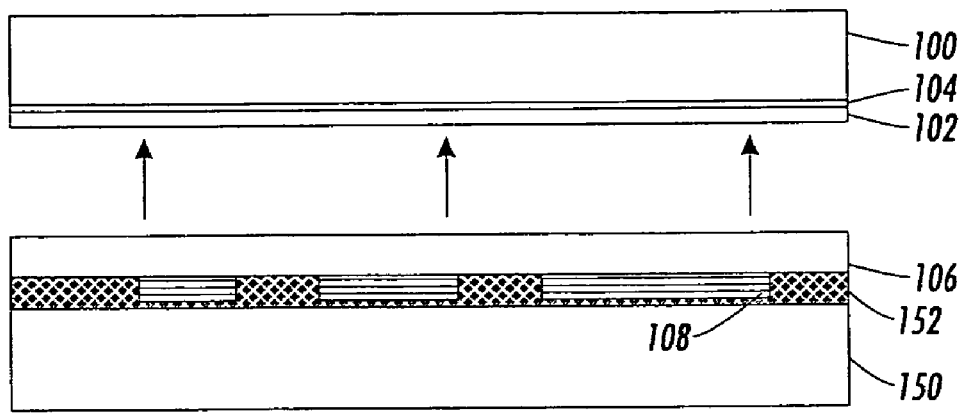
FIG. 8 is an illustration of a part of a method according to the present exemplary embodiments.

Next, referring to FIG. 8, the temporary substrate 100 and release layer 102 have been removed, leaving the ceramic elements such as PZT elements 108 and carrier coating or vehicle layer 106 frozen to the layer 152 of the sintering substrate 150. A sufficient force is simply applied to release the substrate. Advantageously, and as noted above, the frozen water (ice) layer 152 works effectively as an adhesion layer to maintain the ceramic elements as being connected to the sintering substrate 150 so that the temporary substrate 100 and the release layer 102 can be removed without destroying the ceramic elements.

Figure 9:
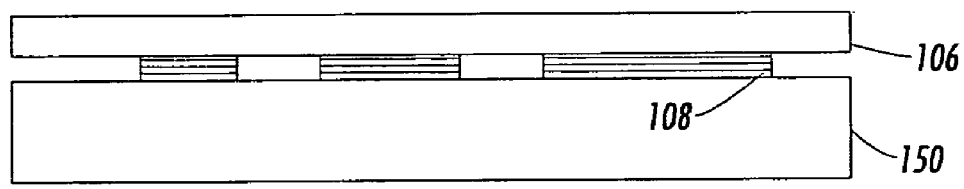
FIG. 9 is an illustration of a part of a method according to the present exemplary embodiments.

With reference to FIG. 9, this remaining assembly has been placed into a drying oven where the water has been allowed to evaporate (at approximately 105° C. for approximately 10 minutes).

Figure 10:
FIG. 10 is an illustration of a part of a method according to the present exemplary embodiments.

Referring to FIG. 10, where the coating layer 106 has been burned away and the ceramic elements such as PZT elements have been sintered at approximately 1100 to 1300° C. for densification. Depending on the materials used to form the ceramic elements, the sintering process could compose of one stage or two stages. For example, for sintering PZT elements, the sintering process may include two stages. The first stage is to slowly heat (e.g., at a ramp rate of 0.2–2° C./min) the PZT elements to 400–800° C. to burn out the carrier coating 106 and organic vehicles in the PZT elements. In this stage, the PZT elements are placed in an open environment. The second stage is that, after cooling down, the PZT elements are placed in a controlled or closed environment, e.g., in a closed crucible, in order to reduce the lead loss at high temperatures, and the PZT elements will be heated to 1100–1300° C. for densification at a relatively fast heating rate (e.g., at a ramp rate of 4–10° C./min). Regardless of the number of stages in the sintering process, the elements should remain in a suitable position with careful handling. If necessary, however, recesses may be formed in the sintering layer to soft hold the ceramic elements so that the configuration/registration of the ceramic elements array will remain intact. Also, the shrinkage in the lateral dimensions will be allowed so that denser ceramic elements can be obtained, and the layer structure may be minimized or eliminated.

Figure 11:
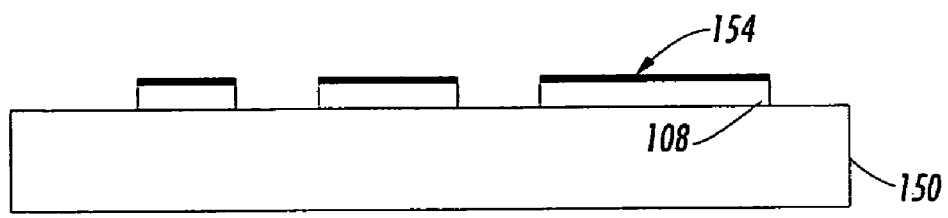
FIG. 11 is an illustration of a part of a method according to the present exemplary embodiments.

As shown in FIG. 11, appropriate electrodes 154 have been deposited. Any suitable techniques for depositing electrodes could be used. However, any such technique should maintain the registration of the elements. In some embodiments, electrode deposition may not be necessary at this point.

Figure 12:
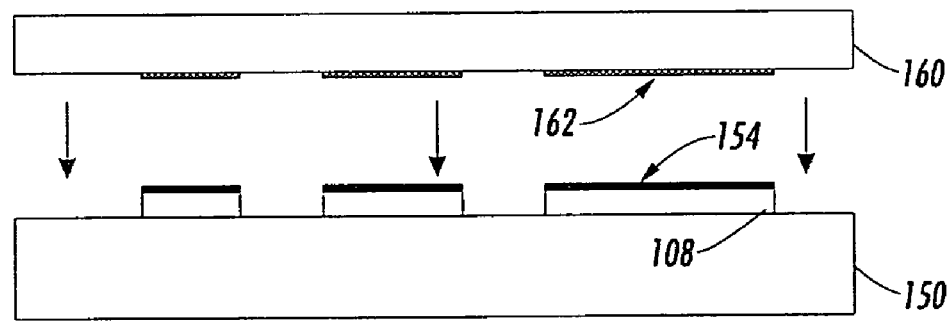
FIG. 12 is an illustration of a part of a method according to the present exemplary embodiments.

After sintering and optional electrode deposition, various bonding methods could be used to bond the ceramic elements to the final target substrate. The final target substrate may take a variety of forms depending on the implementation. For example, it could be of a ceramic material or silicon-based material. If electrical contact between the electrode on the ceramic elements and the target substrate (or surface of the target substrate) is required, one possible bonding method is thin epoxy bonding. Thus the electric contact can be realized through the asperity points on the ceramic elements and/or on the surface of the target substrate. Referring to FIG. 12, an appropriate bonding epoxy 162 has been applied to a target substrate 160 and then placed in register onto the existing assembly. Other bonding techniques such as metal bonding could also be used.

Figure 13:
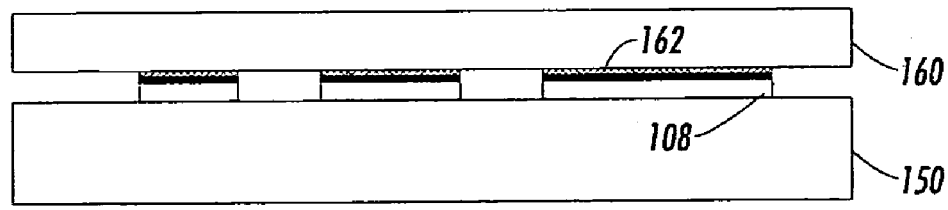
FIG. 13 is an illustration of a part of a method according to the present exemplary embodiments.

Then, as shown in FIG. 13, the target substrate 160 has been bonded to the electrodes 154. This is accomplished with application of a sufficient force.

Figure 14:
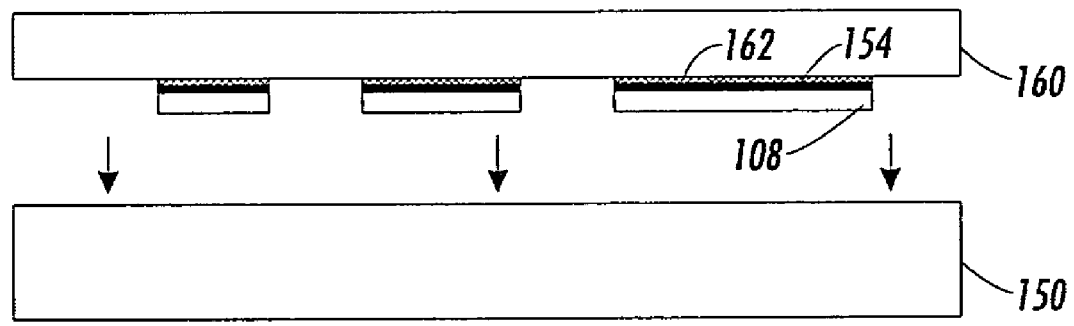
FIG. 14 is an illustration of a part of a method according to the present exemplary embodiments; and, FIG. 15 is an illustration of a part of a method according to the present exemplary embodiments.

As in FIG. 14, the sintering substrate 150 has been removed. A slight force could be used to initiate the removal.

Figure 15:
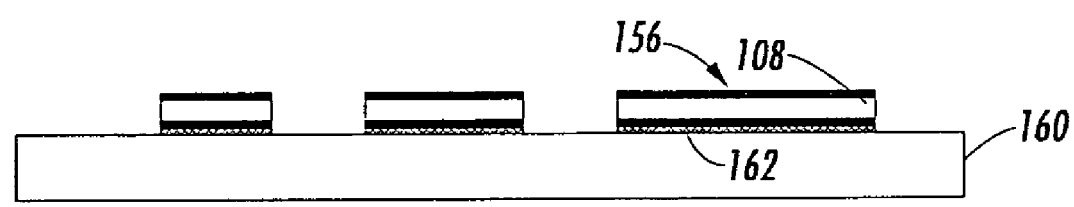

Last, with reference to FIG. 15, the final conductive electrodes 156 have been applied. In some cases, the surface of the ceramic elements may need to be cleaned or polished before applying electrodes. However, as noted above, in some forms, electrodes may not be deposited at this point.

The present exemplary embodiments provide many advantages. For example, a transfer method, without using optics or radiation, is achieved.

Second, high quality ceramic films such as PZT thick film elements can be obtained because the sintering temperatures are not limited by the substrate. Also, a clean and low temperature process is implemented and is desired for the final-use substrate. It is also compatible with silicon microelectronics.

In addition, the cost of the process can be extremely low and very large area ceramic arrays can be made because it avoids the use of sapphire or other expensive substrates.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

The invention claimed is:

1. A method comprising:
   forming ceramic elements on a temporary substrate;
   transferring the ceramic elements onto a sintering substrate having a temporary adhesion layer by transitioning the temporary adhesion layer through phase changes;
   sintering the ceramic elements; and,
   transferring the ceramic elements to a target substrate.

2. The method as set forth in claim 1 wherein the ceramic elements are piezoelectric elements.

3. The method as set forth in claim 1 wherein the ceramic elements are lead zirconate titanate (PZT).

4. The method as set forth in claim 1 wherein the temporary adhesion layer is water.

5. A method for forming thick film ceramic element arrays, the method comprising:
   providing a printing substrate having a release layer;
   applying a carrier coating to the release layer;
   forming ceramic elements on the carrier coating;
   providing a sintering substrate with a temporary adhesion layer;
   joining the printing substrate and the sintering substrate such that the ceramic elements are embedded in the temporary adhesion layer;
   initiating a phase change on the temporary adhesion layer;
   removing the printing substrate and the release layer such that the ceramic elements remain in the temporary adhesion layer;
   removing the temporary adhesion layer such that the ceramic elements remain on the sintering substrate;
   sintering the ceramic elements on the sintering substrate;
   depositing electrodes on the ceramic elements; and,
   transferring the ceramic elements to a target substrate.

6. The method as set forth in claim 5 further comprising providing tape between the release layer and the printing substrate.

7. The method as set forth in claim 5 wherein applying the carrier coating comprises spin coating.

8. The method as set forth in claim 5 wherein the carrier coating is a vehicle used to form ceramic paste.

9. The method as set forth in claim 5 wherein the forming of ceramic elements comprises forming piezoelectric elements.

10. The method as set forth in claim 5 wherein the forming of ceramic elements comprises forming lead zirconate titantate (PZT) elements.

11. The method as set forth in claim 5 wherein the forming of ceramic elements comprises screen printing.

12. The method as set forth in claim 5 wherein the forming of ceramic elements comprises jet printing, extrusion, and other deposition methods.

13. The method as set forth in claim 5 wherein the thickness of the ceramic elements after sintering is between about 10 μm to about 100 μm.

14. The method as set forth in claim 5 wherein the thickness of the ceramic elements after sintering is less than 10 μm or more than 100 μm.

15. The method as set forth in claim 5 wherein the temporary adhesion layer is water.

16. The method as set forth in claim 5 wherein the phase change comprises a change from a liquid phase to a solid phase of water.

17. The method as set forth in claim 5 wherein initiating the phase change comprises freezing.

18. The method as set forth in claim 5 wherein the removing of the adhesion layer comprises melting and drying.

19. The method as set forth in claim 5 further comprising depositing second electrodes on the ceramic elements.

20. A method of forming lead zirconate titanate (PZT) thick film ceramic element arrays, the method comprising:
   providing a printing substrate having a release layer;
   applying a vehicle layer to the release layer;
   forming PZT elements on the vehicle layer;
   providing a sintering substrate with a water layer;
   joining the printing substrate and the sintering substrate such that the PZT elements are wetted by the water layer;

freezing the water layer;
removing the printing substrate and the release layer such that the PZT elements remain in the frozen water layer;
melting and drying the water layer such that the PZT elements remain on the sintering substrate;
sintering the PZT elements on the sintering substrate;
depositing electrodes on the PZT elements; and,
transferring the PZT elements to a target substrate.

* * * * *